(12) United States Patent
Hsieh (10) Patent No.: US 8,004,036 B2
(45) Date of Patent: Aug. 23, 2011

(54) MOSFET-SCHOTTKY RECTIFIER-DIODE INTEGRATED CIRCUITS WITH TRENCH CONTACT STRUCTURES FOR DEVICE SHRINKAGE AND PERFORMANCE IMPROVEMENT

(75) Inventor: Fu-Yuan Hsieh, Kaohsiung (TW)

(73) Assignee: Force Mos Technology Co., Ltd. (TW)

( * ) Notice: Subject to any disclaimer, the term of this patent is extended or adjusted under 35 U.S.C. 154(b) by 358 days.

(21) Appl. No.: 12/292,486

(22) Filed: Nov. 20, 2008

(65) Prior Publication Data

US 2010/0123185 A1  May 20, 2010

(51) Int. Cl.
*H01L 31/119* (2006.01)

(52) U.S. Cl. .. 257/328; 257/330; 257/334; 257/E29.262

(58) Field of Classification Search ........... 257/638–337
See application file for complete search history.

(56) References Cited

U.S. PATENT DOCUMENTS

| 7,511,357 B2 * | 3/2009 | Hshieh .......... 257/551 |
| 2005/0029585 A1 * | 2/2005 | He et al. .......... 257/330 |

\* cited by examiner

*Primary Examiner* — Dung A. Le
(74) *Attorney, Agent, or Firm* — Bacon & Thomas, PLLC (57) ABSTRACT

A trench MOSFET device with embedded Schottky rectifier, Gate-Drain and Gate-Source diodes on single chip is formed to achieve device shrinkage and performance improvement. The present semiconductor devices achieve low Vf and reverse leakage current for embedded Schottky rectifier, have overvoltage protection for GS clamp diodes and avalanche protection for GD clamp diodes.

18 Claims, 11 Drawing Sheets

Fig.1 (Pior Art)

MOSFET-SCHOTTKY RECTIFIER-DIODE INTEGRATED CIRCUITS WITH TRENCH CONTACT STRUCTURES FOR DEVICE SHRINKAGE AND PERFORMANCE IMPROVEMENT

FIELD OF THE INVENTION

This invention relates generally to the cell structure, device configuration and fabrication process of power semiconductor devices. More particularly, this invention relates to an improved cell configuration and processes to manufacture trench MOSFET device with Schottky rectifier, Gate-Drain (GD) and Gate-Source (GS) diodes on single chip for device shrinkage and performance improvement.

BACKGROUND OF THE INVENTION

Figure 1:
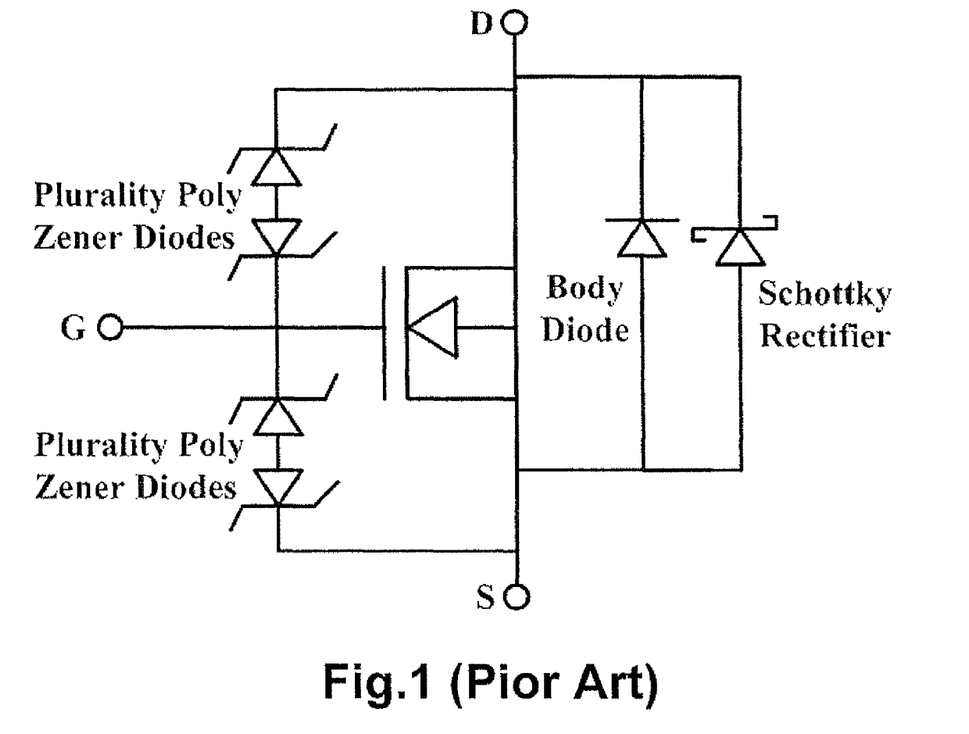
FIG. 1 is a conventional application circuit of the MOSFET power device with integration of Schottky rectifier, GD and GS diodes in single package.

As shown in FIG. 1, normally for high efficiency DC/DC application, a Schottky rectifier is externally added in parallel with a MOSFET device to prevent a parasitic P/N body diode in the MOSFET from turning on in order to achieve higher speed and efficiency. The requirement for the clamping effect is that the forward voltage of the Schottky rectifier Vf is less than the parasitic body PN diode (~0.7V). Besides the Schottky rectifier, a Gate-Source clamp diode with a breakdown voltage lower than the gate oxide rupture voltage of the MOSFET are provided for gate oxide ESD (electrostatic discharge) protection. Moreover, a Gate-Drain clamp diode with a breakdown voltage lower than that of the MOSFET are provided for Drain-Source avalanche protection. However, assembly of those separately structures into single package with extra interconnection wires results in higher manufacturing cost, and poor performance due to increase in inductance from the extra interconnection wires.

Accordingly, it would be desirable to provide more integrated trench MOSFET device with embedded Schottky rectifier, Gate-Drain and Gate-Source diodes on single chip for device shrinkage and performance improvement.

SUMMARY OF THE INVENTION

It is therefore an aspect of the present invention to provide improved semiconductor power device configuration and manufacture processes for providing trench MOSFET device with embedded Schottky rectifier, Gate-Drain and Gate-Source diodes on single chip so that space occupied can be reduced, and performance improved.

Another aspect of the present invention is to provide improved semiconductor power device configuration and manufacture processes for providing trench MOSFET devices with embedded Schottky rectifier on single chip.

Another aspect of the present invention is to provide improved semiconductor power device configuration and manufacture processes for providing trench MOSFET devices with embedded Schottky rectifier, Gate-Source diode on single chip.

Another aspect of the present invention is to provide improved semiconductor power device configuration and manufacture processes for providing trench MOSFET devices with embedded Schottky rectifier, Gate-Drain diode on single chip.

Another aspect of the present invention is to provide improved semiconductor power device configuration and manufacture processes for providing trench MOSFET devices with embedded Gate-Drain and Gate-Source diodes on single chip.

Briefly, in a preferred embodiment, the present invention discloses a semiconductor power device comprising a trenched MOSFET with a trenched junction barrier Schottky rectifier and two diodes on single chip. The trenched junction barrier Schottky rectifier with a lower forward voltage is connected in parallel to the MOSFET as a clamp diode to prevent the parasitic PN body diode from turning on. The first Zener diode connects between a gate metal and a drain metal of said semiconductor power device functioning as a Gate-Drain (GD) clamp diode. The GD clamp diode further includes multiple back-to-back doped regions in a polysilicon layer doped with dopant ions of a first conductivity type next to a second conductivity type disposed on an insulation layer above the MOSFET device, having an avalanche voltage lower than a source/drain avalanche voltage of the MOSFET device wherein the Zener diode is insulated from a doped region of the MOSFET device. The second Zener diode connects between a gate metal and a source metal of the said MOSFET device for functioning as a Gate-Source clamp diode, wherein the GS clamp diode further includes multiple back-to-back doped regions in a polysilicon layer doped with dopant ions of a first conductivity type next to a second conductivity type disposed on an insulation layer above the MOSFET device, having a lower breakdown voltage than a gate oxide rupture voltage of the MOSFET device. In an exemplary embodiment, the structure disclosed is the same as the structure mentioned in the first embodiment except that there is a trench Schottky diode functioning as a clamp diode in parallel to the MOSFET device with the parasitic PN body diode instead of the junction barrier Schottky rectifier.

These and other objects and advantages of the present invention will no doubt become obvious to those of ordinary skill in the art after having read the following detailed description of the preferred embodiment, which is illustrated in the various drawing figures.

DETAILED DESCRIPTION OF THE EMBODIMENTS

Figure 2A:
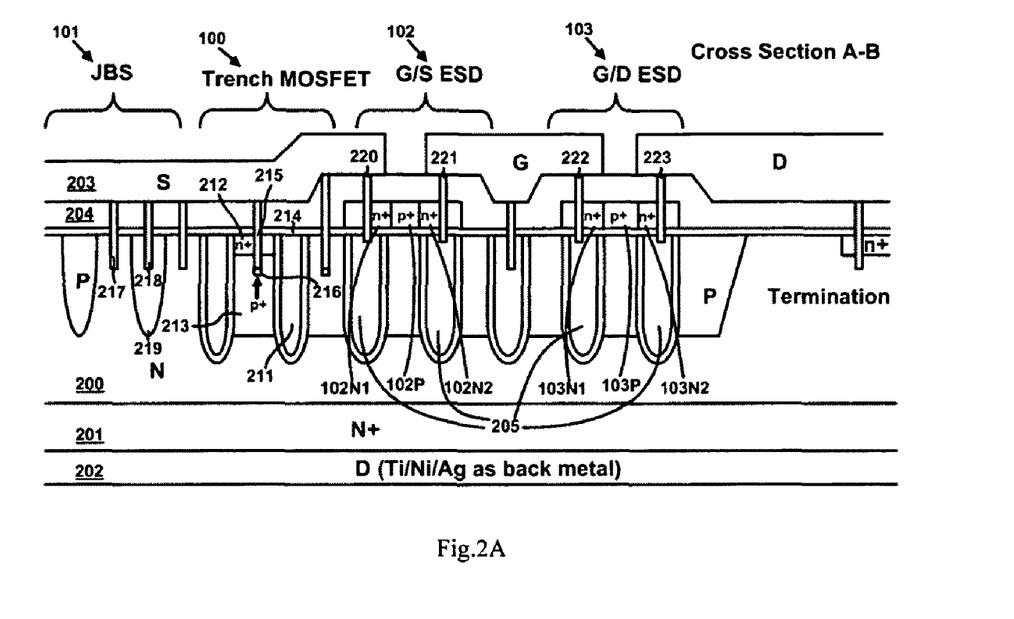
FIG. 2A is a cross-section of an integrated trench MOSFET with embedded junction barrier Schottky rectifier, GD and GS diodes structure of the first embodiment for the present invention. The cross section location is identified with A-B line of Top View in FIG. 2C
Figure 2B:
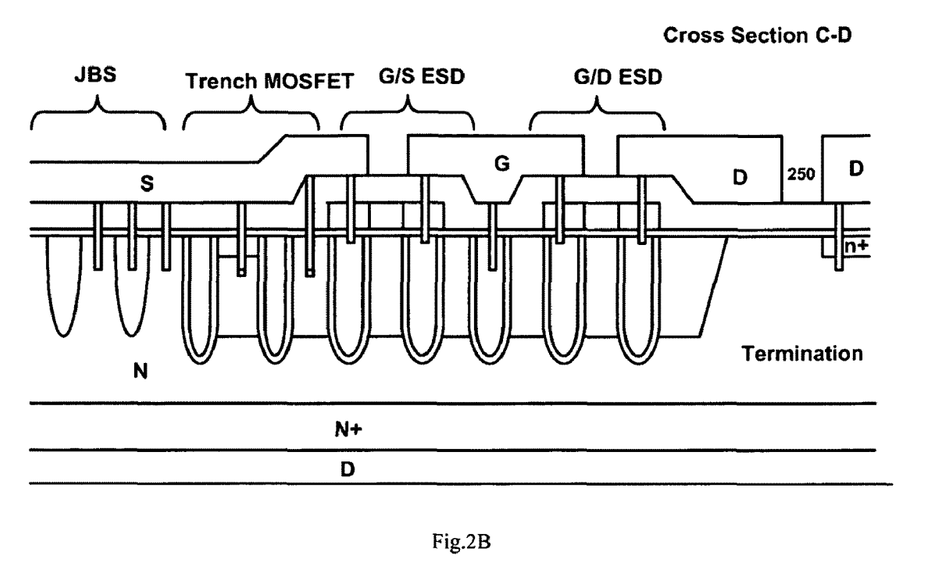
FIG. 2B is another cross-section of an integrated trench MOSFET with embedded junction barrier Schottky rectifier, GD and GS diodes structure of the first embodiment for the present invention. The cross section location is identified with C-D line of Top View in FIG. 2C
Figure 2C:
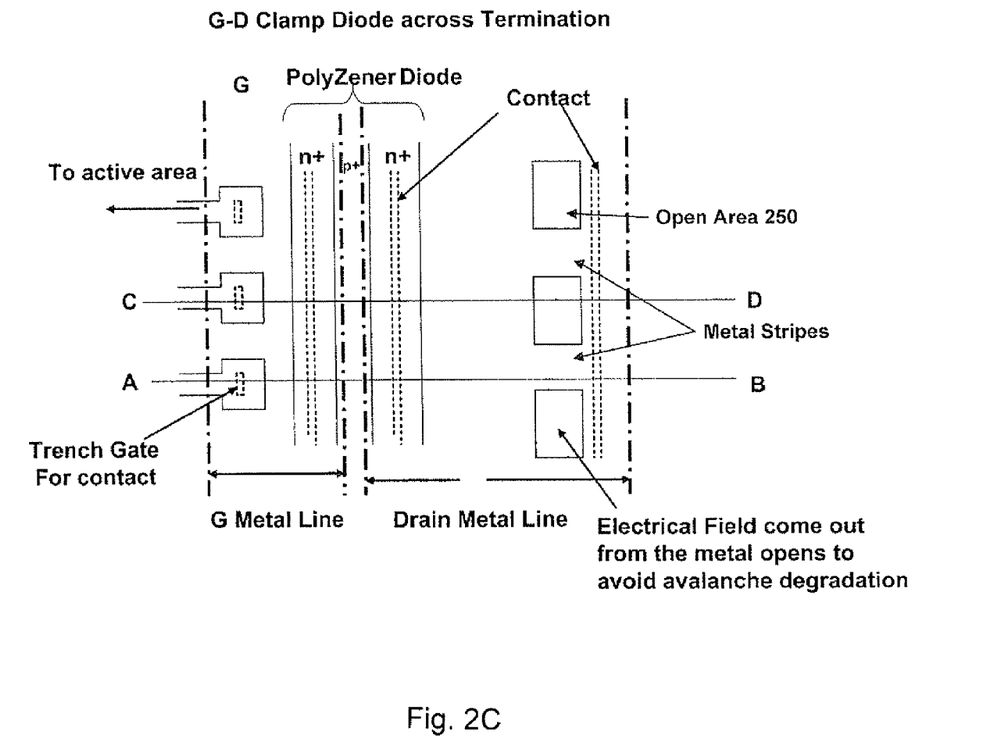
FIG. 2C is a top view of an integrated trench MOSFET with embedded Schottky rectifier, GD and GS diodes structure of the first embodiment for the present invention.

Please refer to FIGS. 2A to 2C for a first preferred embodiment of this invention. FIG. 2A is a cross-section A-B in FIG. 2C of this embodiment which shows a trenched MOSFET device 100 implemented with junction barrier Schottky rectifier 101, Gate-Source polysilicon Zener clamp diodes 102 and Gate-Drain polysilicon Zener clamp diodes 103 formed in an N epitaxial layer 200 above the a heavily N+doped substrate 201 coated with back metal of Ti/Ni/Ag 202 on rear side as drain. A trenched gate 211 surrounded by a source region 212 encompassed in a body region 213. An oxide layer 204 covering the trenched semiconductor power device with a source-body contact trench 215 opened through and extending into the source and body regions and filled with tungsten plugs therein. A layer of Al Alloys or Copper 203 serves as source metal on an oxide layer 204 deposited along the top surface of the insulation layer 214. The region 216 is heavily P doped to reduce the resistance between said trench contact metal plug 215 and said body region. The junction barrier Schottky contact trench 217 is formed in said N epitaxial layer with other contact trench 218 formed in the P-well 219 adjacent to said junction barrier Schottky contact trench filled with Tungsten plug connected to said source metal serving as anode of said Schottky rectifier. In order to provide the Gate-Source polysilicon Zener clamp diodes 102 and Gate-Drain polysilicon Zener clamp diodes 103, a polysilicon layer are formed on said oxide layer 204 and doped as alternating N+ and P+ regions adjacent to each other. The N+ doped polysilicon regions 102N1, 102N2 and the P+ doped polysilicon region 102P constitute the GS polysilicon Zener clamp diodes 102 while the N+ doped regions 103N1, 103N2 and the P+ doped polysilicon region 103P constitute the GD polysilicon Zener clamp diodes 103. The contact trench 220 is formed to connect the source metal with the n+ doped polysilicon region 102N1 of the GS polysilicon Zener clamp diodes. The contact trench 221 is formed to connect the gate metal with the n+ doped polysilicon region 102N2 of the GS polysilicon Zener clamp diodes. The contact trench 222 is formed to connect the gate metal with the n+ doped polysilicon region 103N1 of the GD polysilicon Zener clamp diodes. And the contact trench 223 is formed to connect the drain metal with the n+ doped polysilicon region 103N2 of the GD polysilicon Zener clamp diodes. Trench gates 205 in FIG. 2A are formed underneath the contact trench 220, 221 222 and 223 acting as buffer layers to avoid the zener diodes shorting with the P-body 213.

FIG. 2B is another cross-section C-D of the first embodiment as shown in FIG. 2C. The only difference between FIG. 2B and FIG. 2A is that there is an open area 250 of the drain metal on the top of the termination. A conventional metal field plate in the termination is provided to sustain breakdown voltage.

FIG. 2C is a top view of the first embodiment which shows Gate-Drain diode across termination with the open areas 250 in FIG. 213 of the drain metal having a plurality of metal stripes. Each of metal stripes is formed between two adjacent open areas 250 in the drain metal. These open areas 250 allow electrical field penetrate through the oxides during avalanche, and thus make benefits to avoid avalanche degradation caused by the metal field plate cross over the termination as shown in FIG. 2A.

Figure 3:
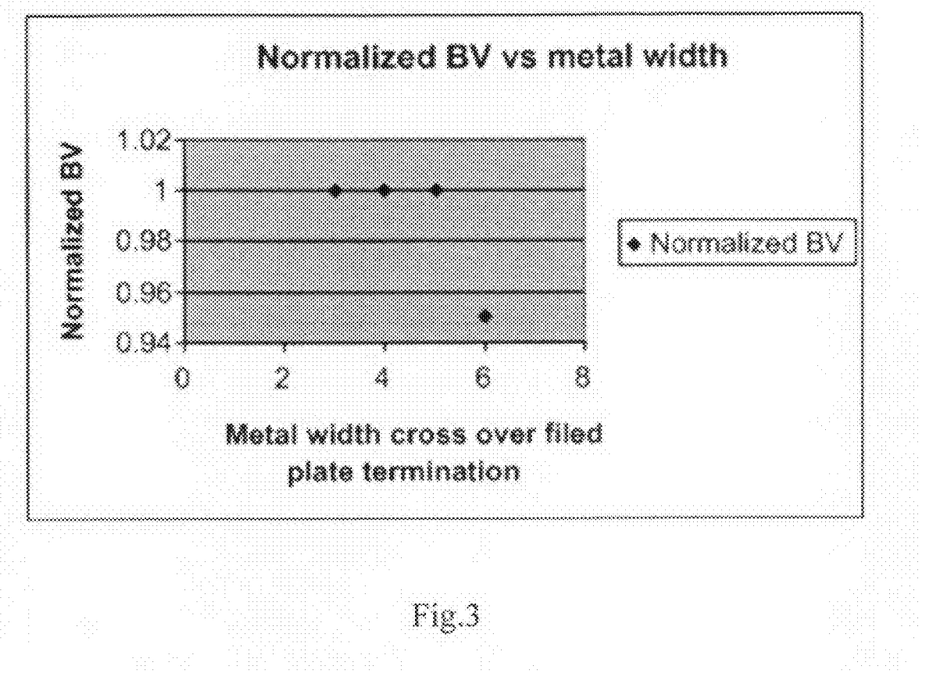
FIG. 3 is a normalized measurement result of the relationship between breakdown voltage and metal width cross over filed plate termination.

FIG. 3 is a normalized measurement result of the relationship between breakdown voltage and metal width cross over metal field plate termination, which shows that breakdown voltage will be degraded when the metal width of the metal stripes in FIG. 2C is greater than 5 um, It means that electrical field underneath the cross-over metal can not effectively goes through the open area 250 if the metal width is larger than 5 um.

Figure 4A:
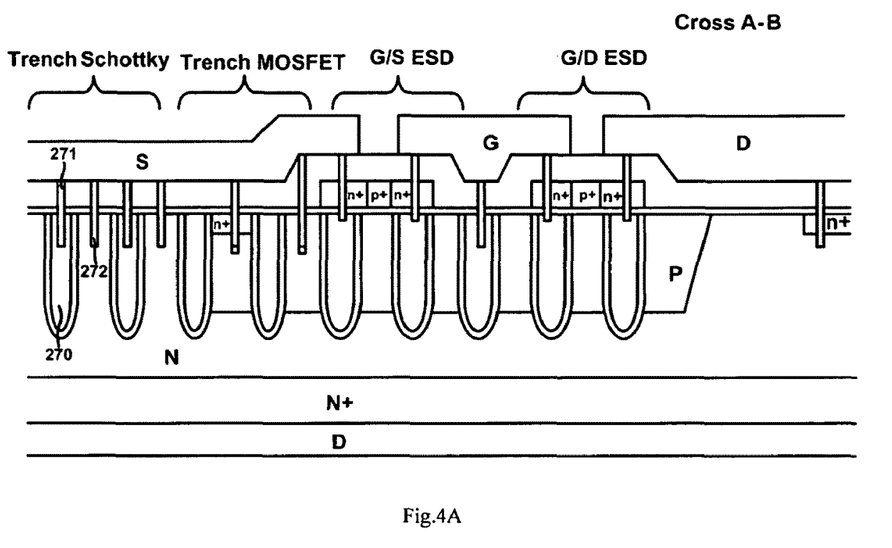
FIG. 4A is a cross-section of an integrated trench MOSFET with embedded trench Schottky rectifier, GD and GS diodes structure of another embodiment for the present invention. The cross section location is identified with A-B line of Top View in FIG. 2C

FIG. 4A is the cross-section A-B of the second embodiment of the present invention. The only difference between the structure of FIG. 4A and FIG. 2.A is that the embedded Schottky rectifier is a trench Schottky rectifier instead of junction barrier Schottky rectifier. The trench Schottky contact trench 272 is formed in said N epitaxial layer and other contact trench 271 formed in the trench gate 270 adjacent to said contact trench.

Figure 4B:
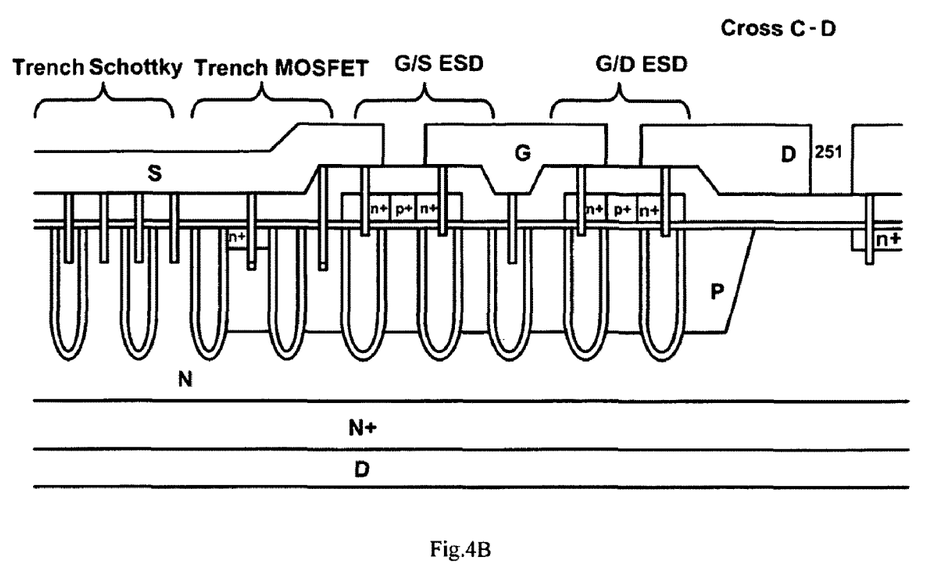
FIG. 4B is another cross-section of an integrated trench MOSFET with embedded trench Schottky rectifier, GD and GS diodes structure of the second embodiment for the present invention. The cross section location is identified with C-D line of Top View in FIG. 2C FIGS. 5A to 5D are a serial of side cross sectional views showing the processing steps for fabricating a MOSFET device as shown in FIG. 4A and FIG. 4B of this invention.

FIG. 4B is another cross-section C-D of the second embodiment. The only difference between FIG. 4B and FIG. 4A is that there is an open area 251 of the drain metal on the top of the termination.

Figure 5A:
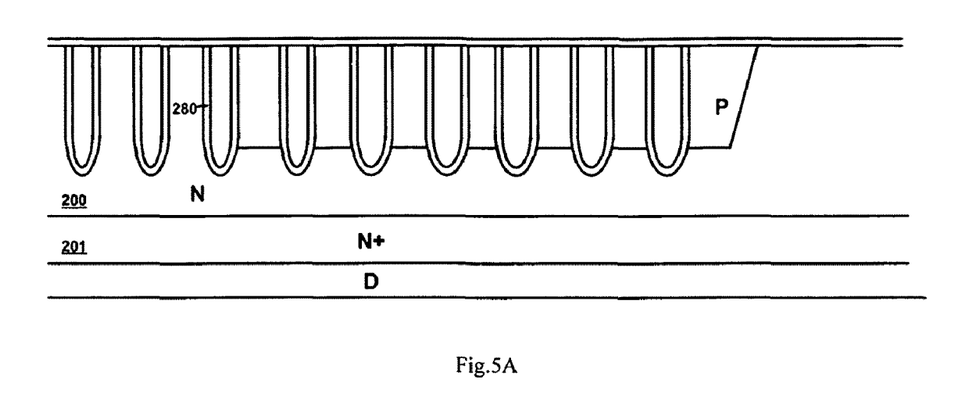

FIGS. 5A to 5D are a serial of exemplary steps that are performed to form the inventive device configuration of FIG. 4A. FIG. 5A shows that an N doped epitaxial layer 200 is grown on an N+ doped substrate 201. A trench mask (not shown) is applied to open a plurality of trenches by employing a dry silicon etch process. An oxidation process is then performed to form an oxide layer 280 covering the entire structure after a sacrificial oxide is grown and removed. After the formation of the gate oxide, a doped poly is filled into the trenches and then etched back, serving as the gate material. A P-body mask is employed in the P-body Ion Implantation and followed by diffusion process to form the body region 213, and an oxide layer 214 is grown on the top of the entire structure.

Figure 5B:
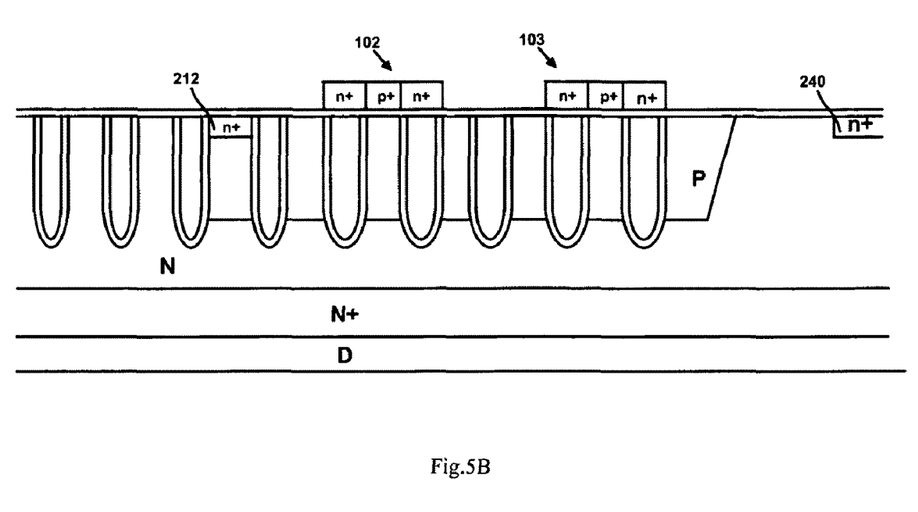

In FIG. 5B, a layer of undoped poly is deposited on the surface of the structure, and a poly mask is applied in a dry silicon etch process to form GS polysilicon Zener clamp diodes 102 and GD polysilicon Zener clamp diodes 103 after a Blank Boron Ion Implantation. Next, an N+ source mask is employed in the N+ source Ion Implantation and followed by diffusion process to form the cathodes of said Zener clamp diodes, source region 212 and N+ region 240.

Figure 5C:
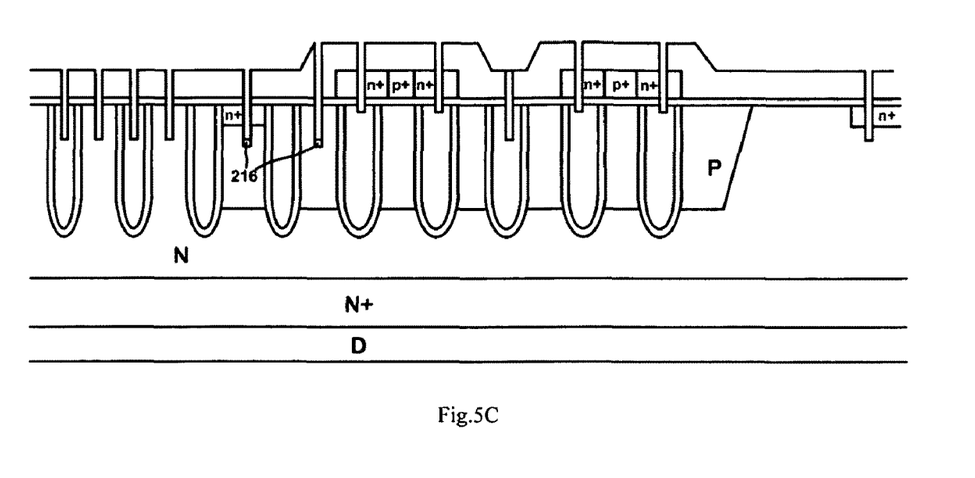

In FIG. 5C, an oxide layer is deposited to cover the entire structure, and a contact mask is employed in a dry silicon etch process. After the formation of all the contact trenches, a BF2 mask is employed in the BF2 Ion Implantation to form the more heavily doped region 216 to reduce the resistance between said trench contact metal plug and said body region.

Figure 5D:
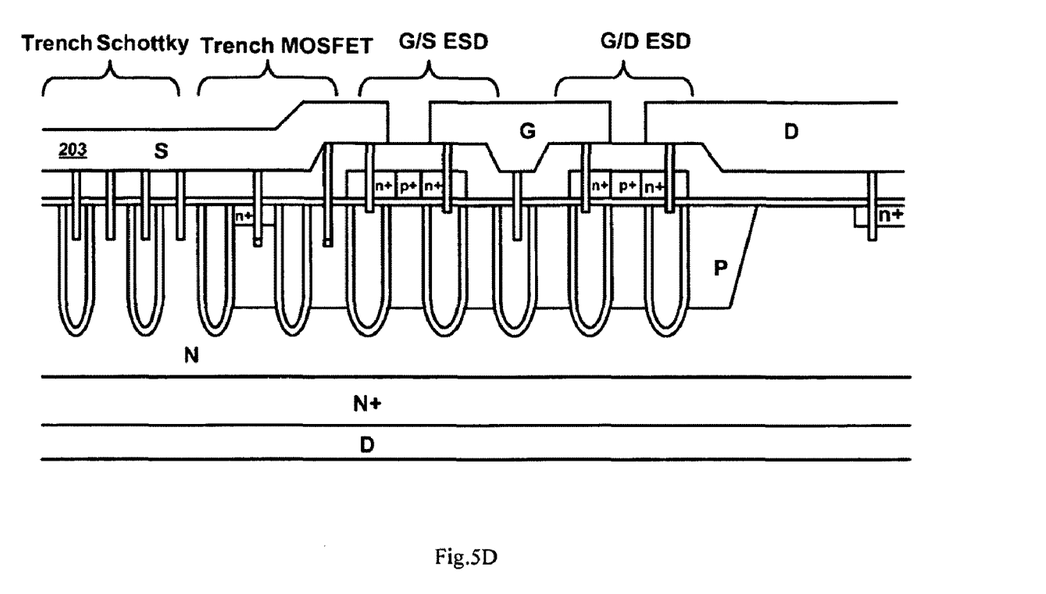

In FIG. 5D, a layer of Ti/TiN, Co/TiN or Mo/TiN (not shown) is deposited along the sidewall of each trench. To fill the contact trenches, tungsten is deposited serving as plug metal followed by a CMP process. Last, a metal mask is employed in the deposition process to form a layer of front metal of Al Alloys 203 above the entire structure.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit compromises trench MOSFET, Schottky rectifier, Gate-Drain and Gate-Source clamp diodes with trench contact structure for device shrinkage and performance improvement on single chip wherein:

a substrate of the first conductivity type;
an epitaxial layer of said first conductivity type over said substrate, said epitaxial layer having a lower doping than said substrate;
a trench MOSFET comprising a trenched gate surrounded by a source region of said first conductivity type encompassed in a body region of second conductivity type above a drain region disposed on a bottom surface of a substrate;
a gate oxide lining said trenches;
a doped polysilicon within said trenches and overlying said gate oxide;
a Schottky rectifier extending into said epitaxial layer and having a Schottky barrier layer lined in trench contacts filled with contact metal plug;
a Gate-Drain clamp diode compromises a plurality of back to back polysilicon zener diode with dopant ions of a first conductivity type next to a second conductivity type, connected with gate on one side, and drain on another side through a plurality of metal stripes cross over termination area;
a Gate-Source Clamp diode compromises a plurality of back to back polysilicon zener diode with dopant ions of a first conductivity type next to a second conductivity type, connected with gate on one side, and source on another side.

2. The integrated circuits of claim 1 wherein:
said the Schottky rectifier is trench Schottky rectifier having a Schottky barrier layer lined in trench contact filled with contact metal plug and between a pair of adjacent trenches.

3. The integrated circuits of claim 1 wherein:
said the Schottky rectifier is Junction Barrier Schottky rectifier having a Schottky barrier layer lined in trench contact filled with contact metal plug and between a pair of adjacent P wells.

4. The Integrated circuits device of claim 1 wherein:
said integrated circuit comprising a N-channel trench MOSFET, and said Gate-Drain and Gate-Source Clamp diodes comprising multiple back-to-back doped regions in said polysilicon layer doped with N+ dopant ions next to a P dopant ions, The trench gates in the diode regions are underneath contact areas of said Gate-Drain and Gate-Source diodes.

5. An integrated circuit compromises trench MOSFET, Schottky rectifier and Gate-Source clamp diodes with trench contact structure for device shrinkage and performance improvement on single chip wherein:
a substrate of the first conductivity type;
an epitaxial layer of said first conductivity type over said substrate, said epitaxial layer having a lower doping than said substrate;
a trench MOSFET comprising a trenched gate surrounded by a source region of said first conductivity type encompassed in a body region of second conductivity type above a drain region disposed on a bottom surface of a substrate;
a gate oxide lining said trenches;
a doped polysilicon within said trenches and overlying said gate oxide;
a Schottky rectifier extending into said epitaxial layer and having a Schottky barrier layer lined in trench contacts filled with contact metal plug;
a Gate-Source Clamp diode compromises a plurality of back to back polysilicon zener diode with dopant ions of a first conductivity type next to a second conductivity type, connected with gate on one side, and source on another side.

6. The integrated circuits of claim 5 wherein:
said the Schottky rectifier is trench Schottky rectifier having a Schottky barrier layer lined in trench contact filled with contact metal plug and between a pair of adjacent trenches.

7. The integrated circuits of claim 5 wherein:
said the Schottky rectifier is Junction Barrier Schottky rectifier having a Schottky barrier layer lined in trench contact filled with contact metal plug and between a pair of adjacent P wells.

8. The Integrated circuits device of claim 5 wherein:
said integrated circuit comprising a N-channel trench MOSFET, and said Gate-Source Clamp diodes comprising multiple back-to-back doped regions in said polysilicon layer doped with N+ dopant ions next to a P dopant ions, The trench gates in the diode region are underneath contact areas of said Gate-Source diode.

9. An integrated circuit compromises trench MOSFET, Schottky rectifier and Gate-Drain clamp diode with trench contact structure for device shrinkage and performance improvement on single chip wherein:
a substrate of the first conductivity type;
an epitaxial layer of said first conductivity type over said substrate, said epitaxial layer having a lower doping than said substrate;
a trench MOSFET comprising a trenched gate surrounded by a source region of said first conductivity type encompassed in a body region of second conductivity type above a drain region disposed on a bottom surface of a substrate;
a gate oxide lining said trenches;
a doped polysilicon within said trenches and overlying said gate oxide;
a Schottky rectifier extending into said epitaxial layer and having a Schottky barrier layer lined in trench contacts filled with contact metal plug;
a Gate-Drain clamp diode compromises a plurality of back to back polysilicon zener diode with dopant ions of a first conductivity type next to a second conductivity type, connected with gate on one side, and drain on another side through a plurality of metal stripes cross over termination area.

10. The integrated circuits of claim 9 wherein:
said the Schottky rectifier is trench Schottky rectifier having a Schottky barrier layer lined in trench contact filled with contact metal plug and between a pair of adjacent trenches.

11. The integrated circuits of claim 9 wherein:
said the Schottky rectifier is Junction Barrier Schottky rectifier having a Schottky barrier layer lined in trench contact filled with contact metal plug and between a pair of adjacent P wells.

12. The Integrated circuits device of claim 9 wherein:
said integrated circuit comprising a N-channel trench MOSFET, and said Gate-Drain Clamp diode comprising multiple back-to-back doped regions in said polysilicon layer doped with N+ dopant ions next to a P dopant ions, The trench gates are underneath contact areas of said Gate-Drain diode.

13. An integrated circuit compromises trench MOSFET, Gate-Drain and Gate-Source clamp diodes with trench contact structure for device shrinkage and performance improvement on single chip wherein:
a substrate of the first conductivity type;

an epitaxial layer of said first conductivity type over said substrate, said epitaxial layer having a lower doping than said substrate;

a trench MOSFET comprising a trenched gate surrounded by a source region of said first conductivity type encompassed in a body region of second conductivity type above a drain region disposed on a bottom surface of a substrate;

a gate oxide lining said trenches;

a doped polysilicon within said trenches and overlying said gate oxide;

a Gate-Drain clamp diode compromises a plurality of back to back polysilicon zener diode with dopant ions of a first conductivity type next to a second conductivity type, connected with gate on one side, and drain on another side through a plurality of metal stripes cross over termination area;

a Gate-Source Clamp diode compromises a plurality of back to back polysilicon zener diode with dopant ions of a first conductivity type next to a second conductivity type, connected with gate on one side, and source on another side.

14. The Integrated circuits device of claim 13 wherein:

said integrated circuit comprising a N-channel trench MOSFET, and said Gate-Drain and Gate-Source Clamp diodes comprising multiple back-to-back doped regions in said polysilicon layer doped with N+ dopant ions next to a P dopant ions, The trench gates in the diode regions are underneath contact areas of said Gate-Drain and Gate-Source diodes.

15. An integrated circuit compromises trench MOSFET and Gate-Source clamp diode with trench contact structure for device shrinkage and performance improvement on single chip wherein:

a substrate of the first conductivity type;

an epitaxial layer of said first conductivity type over said substrate, said epitaxial layer having a lower doping than said substrate;

a trench MOSFET comprising a trenched gate surrounded by a source region of said first conductivity type encompassed in a body region of second conductivity type above a drain region disposed on a bottom surface of a substrate;

a gate oxide lining said trenches;

a doped polysilicon within said trenches and overlying said gate oxide;

a Gate-Source Clamp diode compromises a plurality of back to back polysilicon zener diode with dopant ions of a first conductivity type next to a second conductivity type, connected with gate on one side, and source on another side.

16. The Integrated circuits device of claim 15 wherein:

said integrated circuit comprising a N-channel trench MOSFET, and said Gate-Source Clamp diodes comprising multiple back-to-back doped regions in said polysilicon layer doped with N+ dopant ions next to a P dopant ions, The trench gates in the diode region are underneath contact areas of said Gate-Source diode.

17. An integrated circuit compromises trench MOSFET and Gate-Drain clamp diode with trench contact structure for device shrinkage and performance improvement on single chip wherein:

a substrate of the first conductivity type;

an epitaxial layer of said first conductivity type over said substrate, said epitaxial layer having a lower doping than said substrate;

a trench MOSFET comprising a trenched gate surrounded by a source region of said first conductivity type encompassed in a body region of second conductivity type above a drain region disposed on a bottom surface of a substrate;

a gate oxide lining said trenches;

a doped polysilicon within said trenches and overlying said gate oxide;

a Gate-Drain clamp diode compromises a plurality of back to back polysilicon zener diode with dopant ions of a first conductivity type next to a second conductivity type, connected with gate on one side, and drain on another side through a plurality of metal stripes cross over termination area.

18. The Integrated circuits device of claim 17 wherein:

said integrated circuit comprising a N-channel trench MOSFET, and said Gate-Drain Clamp diodes comprising multiple back-to-back doped regions in said polysilicon layer doped with N+ dopant ions next to a P dopant ions, The trench gates in the diode region are underneath contact areas of said Gate-Drain diode.

* * * * *